United States Patent
Tsuda

(10) Patent No.: US 8,332,995 B2
(45) Date of Patent: Dec. 18, 2012

(54) METHOD OF MANUFACTURING A PIEZOELECTRIC COMPONENT

(75) Inventor: Toshimasa Tsuda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 645 days.

(21) Appl. No.: 12/456,654

(22) Filed: Jun. 19, 2009

(65) Prior Publication Data

US 2009/0315430 A1     Dec. 24, 2009

(30) Foreign Application Priority Data

Jun. 24, 2008   (JP) ................. 2008-164887

(51) Int. Cl.
*H04R 17/10*     (2006.01)
(52) U.S. Cl. .......... 29/25.35; 29/842; 29/852; 310/340; 310/348
(58) Field of Classification Search .............. 29/25.35, 29/842, 846, 852; 310/322, 340, 348, 365
See application file for complete search history.

(56) References Cited

U.S. PATENT DOCUMENTS 6,710,682 B2 *   3/2004   Onishi et al. ............. 29/25.35 X

FOREIGN PATENT DOCUMENTS

| JP | 04-354412 | 12/1992 |
|----|-----------|---------|
| JP | 08-154031 | 6/1996 |
| JP | 2003-188669 | 7/2003 |
| JP | 2004-129224 | 4/2004 |
| JP | 2004-147220 | 5/2004 |
| JP | 2004-274574 | 9/2004 |
| JP | 2006-246112 | 9/2006 |
| JP | 2006-324894 | 11/2006 |
| JP | 2007060319 A * | 3/2007 |
| JP | 2007-165949 | 6/2007 |

* cited by examiner

*Primary Examiner* — A. Dexter Tugbang
(74) *Attorney, Agent, or Firm* — Edwards Wildman Palmer LLP; Scott D. Wofsy

(57) ABSTRACT

A piezoelectric component manufacturing method is provided. The method includes preparing an integrated piezoelectric substrate, and forming comb-shaped electrodes and wiring electrodes having element wiring connecting to the comb-shape electrodes on a primary surface of the piezoelectric substrate, forming an $SiO_2$ layer, performing a characteristics inspection on the piezoelectric substrate and marking defective piezoelectric elements, coating said $SiO_2$ layer surface with photosensitive resin, and then exposing and developing to form an insulating layer. The method includes vapor-depositing a metal layer, and removing said metal layer adhered to resist by an organic solvent when removing the resist, to form a rewiring layer, coating said rewiring layer with photosensitive resin, affixing a photosensitive resin film to a top end surface of said photosensitive resin layer, forming electrode posts in the holes by electroplating, and dicing said piezoelectric substrate along scribe lines to obtain individual piezoelectric components.

10 Claims, 7 Drawing Sheets

(a)

(b)

(c)

(d)

(e)

(f)

METHOD OF MANUFACTURING A PIEZOELECTRIC COMPONENT

BACKGROUND OF THE INVENTION

1. Field of the Invention

The present invention relates to piezoelectric components such as a surface acoustic wave (SAW) device used in a SAW duplexer or SAW filter, or a piezoelectric thin film filter, that are used for example in mobile communication equipment such as mobile telephones, and a manufacturing method thereof, and relates in particular to a chip-size packaged piezoelectric component which enables probe testing at the wafer (piezoelectric substrate) level, and a manufacturing method thereof.

2. Description of Related Art

In a piezoelectric component (SAW device) to be installed in a mobile phone or the like, the formation of a predetermined hollow section around the comb-shaped electrodes (IDT electrodes) thereof is required.

Conventionally, to reduce the size of a SAW device, a SAW element chip is flip-chip bonded (face-down bonded) to a wired substrate using gold (Au) bumps or solder bumps, and the entire SAW element chip is subjected to resin encapsulation by resin or the like to configure a flat type-face SAW device (refer to Japanese Unexamined Patent Publication No. 2004-147220).

In addition, to reduce the size and height of a SAW device, a microminiaturized chip size packaged SAW device is proposed in which a predetermined hollow section is formed around a comb-shaped electrode section (IDT electrode section), and while maintaining this gap, the entire integrated piezoelectric substrate (wafer) on the comb-shaped electrode side, is sealed by resin, external connection electrodes are formed, and then the wafer is divided into individual SAW devices by dicing along predetermined markings (refer to Japanese Unexamined Patent Publication No. 2006-246112).

However, with the piezoelectric components and manufacturing methods thereof described in the related art above, because piezoelectric elements are formed upon a two-dimensional flat surface (principal surface) of the piezoelectric substrate, implementing both an inspection step during the manufacturing process of the piezoelectric element, and an electroplating step carried out in a later step, is extremely difficult, and with plating methods other than electroplating (for example, electroless plating), ensuring high quality and lowering costs for the SAW device is difficult.

In other words, when a probe test of piezoelectric elements is performed on a piezoelectric substrate (wafer), and then plating of predetermined locations thereon is performed, because the terminal electrodes which form the electrode posts will not all have the same electric potential, either electroless plating is performed, or a sheet layer is formed upon the piezoelectric substrate and then protected with a resist before performing electroplating, after which the resist and sheet layer must be removed by etching.

However, after the wiring electrodes are formed on the piezoelectric substrate, once more sealing with resin to form a hollow section surrounded by outer wall sections and a ceiling section is difficult.

Furthermore, when plating is performed directly onto the terminal electrodes, an electroless plating method is needed, but in electroless plating the plating formation speed is extremely slow (in electroless Cu plating, the plating formation speed is slow at approximately 2 μm/hour), and the photosensitive resist already coated onto the piezoelectric substrate has to be immersed long-term in a strong alkaline solution, and consequently a problem occurs in that the resin used for sealing becomes damaged.

Problems to be Solved by the Invention

The problems to be solved by the invention are to check the quality of piezoelectric elements by in-process inspection of piezoelectric components during the manufacturing process, and to reduce production costs, by forming electrodes for use in electroplating on the piezoelectric substrate, after performing an in-process characteristics inspection (probe test) of the piezoelectric elements on the piezoelectric substrate.

SUMMARY OF THE INVENTION

A piezoelectric component of the present invention comprises: a piezoelectric element composed of a piezoelectric substrate, comb-shaped electrodes formed on a principal surface of the piezoelectric substrate, and wiring electrodes having element wiring disposed adjacent to the comb-shaped electrodes; an outer wall section formed from photosensitive resin film with an opening section formed on a principal surface of the piezoelectric substrate; and a ceiling section formed from photosensitive resin film laminated onto a top end surface of the outer wall section; characterized in that a hollow section surrounding the comb-shaped electrodes is formed between the outer wall section and the ceiling section, and electrode posts disposed so as to pass through the outer wall section and the ceiling section and that electrically connect the wiring electrodes and terminal electrodes disposed on a rear surface of the ceiling section are provided, and on a principal surface of the piezoelectric substrate are sequentially formed; a $SiO_2$ layer on the entire principal surface of the piezoelectric surface excluding the terminal electrodes, an insulating layer on the $SiO_2$ layer excluding the comb-shaped electrodes and the wiring electrodes, and a rewiring layer at predetermined locations on the insulating layer excluding the electrode posts.

Furthermore, in the same manner, a piezoelectric component manufacturing method of the present invention comprises: a step for preparing an integrated piezoelectric substrate (wafer), and forming comb-shaped electrodes and wiring electrodes having element wiring connecting to the comb-shape electrodes on a primary surface of the piezoelectric substrate, by sputtering or vapor deposition; a step for forming an $SiO_2$ layer by coating an entire primary surface of the piezoelectric substrate on which the comb-shaped electrodes and the wiring electrodes are formed; a step for coating the $SiO_2$ layer surface, excluding at least the comb-shaped electrodes and the wiring electrodes, with photosensitive resin, and then exposing and developing to form an insulating layer, and performing a characteristics inspection on the piezoelectric substrate, and marking defective piezoelectric elements; a step for vapor-depositing a metal layer serving as an adhesion layer and an electrode layer on a surface of the insulating layer, and removing the metal layer formed on the resist by an organic solvent when removing the resist, to form a rewiring layer (lift-off step); a step for coating the rewiring layer, excluding the comb-shaped electrodes and the wiring electrodes, with photosensitive resin, and then exposing and developing to form a photosensitive resin layer which forms outer wall sections; a step for affixing a photosensitive resin film to a top end surface of the photosensitive resin layer, and then exposing and developing to form ceiling sections, and at the same time removing the photosensitive resin layer and the photosensitive film at the region where electrode posts are to be formed, to form holes; a step for forming electrode posts in the holes by electroplating; and a step for dicing, after the electroplating is completed, the piezoelectric substrate along scribe lines to obtain individual piezoelectric components.

Effects of the Invention

According to the present invention, in-process characteristics inspection of the piezoelectric elements which is essential during the manufacturing process of the piezoelectric component is enabled, and electroplating of the terminal electrodes becomes possible, which stabilizes the quality of the piezoelectric component. In addition, plating time is shortened, and cost reduction is achieved due to the low cost of plating solutions for electroplating.

DETAILED DESCRIPTION OF THE PREFERRED EMBODIMENTS

Hereafter, the piezoelectric component of the present invention, and manufacturing method thereof, are described with reference to an embodiment of a SAW device.

Piezoelectric Component (SAW Device)

Figure 1:
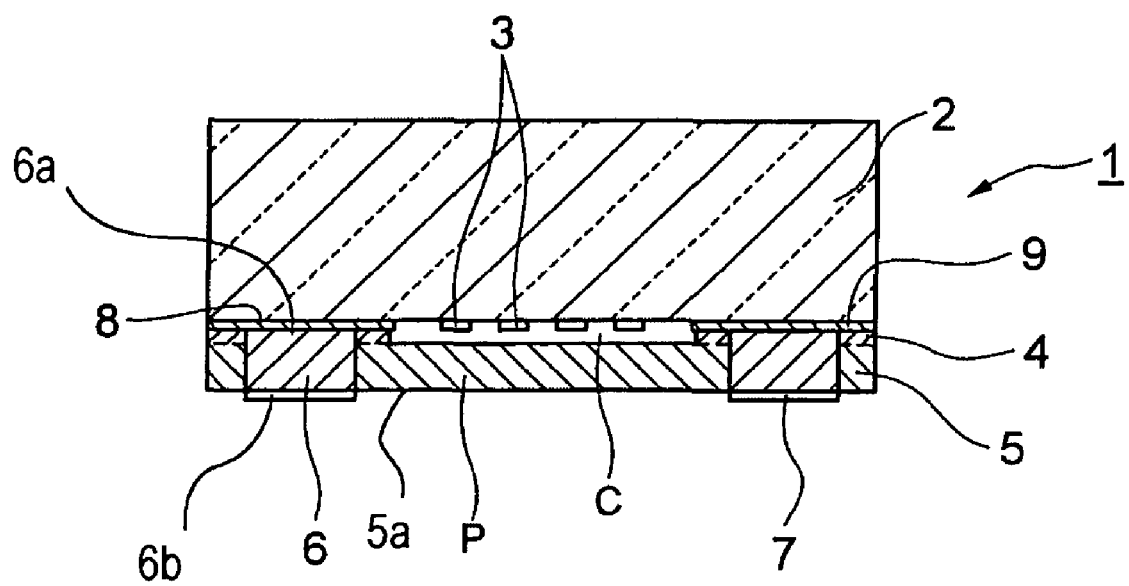
FIG. 1 shows a SAW device serving as an embodiment of the piezoelectric component of the present invention.

FIG. 1 shows a SAW device serving as an embodiment of the piezoelectric device of the present invention.

This SAW device 1, as shown in FIG. 1, comprises: a piezoelectric substrate (wafer) 2 of lithium tantalite ($LiTaO_3$) or lithium niobate ($LiNbO_3$), or a piezoelectric substrate having piezoelectric functionality formed on a substrate; IDT electrodes 3 formed from aluminum film vapor-deposited onto the principal surface of the piezoelectric substrate 2; an outer wall section 4 formed from a photosensitive resin film laminated onto the principal surface of the piezoelectric substrate 2 and having an opening; and a ceiling section 5 formed from the same photosensitive film laminated onto the top end surface of the outer wall section 4, wherein a hollow section C which surrounds the IDT electrodes 3 and wiring electrodes is formed between the laminated outer wall section 4 and ceiling section 5.

In addition, of the piezoelectric substrate 2, for example, at the four corners thereof, four electrode posts 6 are formed by electroplating inside holes formed in a sealing resin P, top end sections 6a of the electrode posts 6 are electrically connected to wiring electrodes formed on the principal surface of the piezoelectric substrate 2, and the other end sections 6b thereof are electrically connected to terminal electrodes 7.

Furthermore, the element wiring which forms the wiring electrodes is formed from a material having any one of Al, Cu, Au, Cr, Ru, Ni, Ti, W, V, Ta, Mo, Ag, In, and Sn as a main component, or from an alloy of these materials, in a multilayer configuration.

In addition, a metallic layer is formed on the inner wall surface of the outer wall section 4 and the inner wall surface of the ceiling section 5 which form the sealing frame, and the surfaces of the IDT electrodes 3 and wiring electrodes.

Furthermore, on the principal surface of the piezoelectric substrate 2 where the IDT electrodes 3 and the wiring electrodes are formed, a $SiO_2$ layer, an insulating layer 8 formed from photosensitive resin, and a rewiring layer 9 comprising Cr as an adhesion layer and Cu as a conductor layer, are sequentially formed.

Furthermore, by using the principal surface of the piezoelectric substrate 2, the electrode posts 6, and the insulating layer 8 or the rewiring layer 9, or by forming wiring on the rear surface 5a (the opposite side from the hollow section C) of the ceiling section 5, a circuit (distributed constant circuit) using a distributed constant (stray capacitance, wiring length, or the like) is formed. Moreover a circuit which forms a resonant circuit in combination with impedance matching, phase shifting, or the IDT electrodes 3, is formed using part or all of the principal surface of the piezoelectric substrate 2, and the ceiling section 5, the electrode posts 6, the insulating layer 8, and the rewiring layer 9.

Furthermore, after forming the electrode posts 6, an additional distributed constant circuit is formed on the rear surface of the ceiling section 5, to form the terminal electrodes 7.

Piezoelectric Component Manufacturing Method

Next, a piezoelectric component manufacturing method of the present invention is described, with reference to an embodiment of a SAW device.

Figure 2:
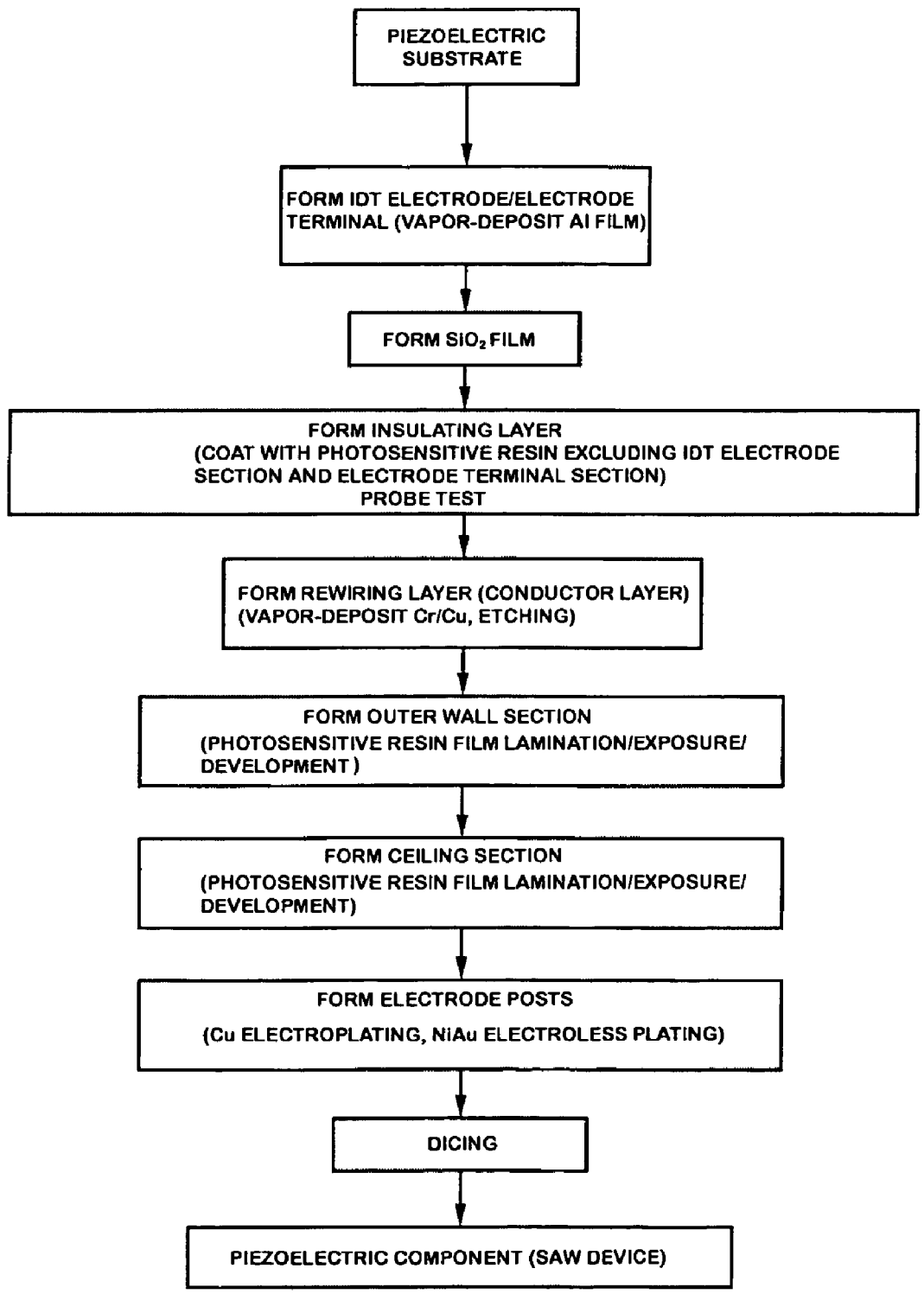
FIG. 2 is a schematic process drawing showing a method of manufacturing a SAW device serving as an embodiment of the piezoelectric component of the present invention.

First, an overview of the embodiment is described based on FIG. 2.

Figure 5:
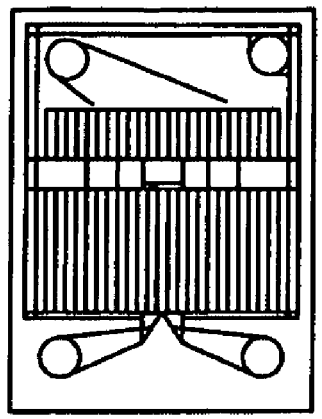
FIG. 5 is a plan view of the various masks (reticles) used in the SAW device manufacturing method shown in FIG. 2.
Figure 5:
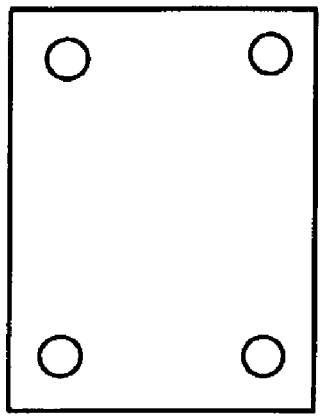
Figure 5:
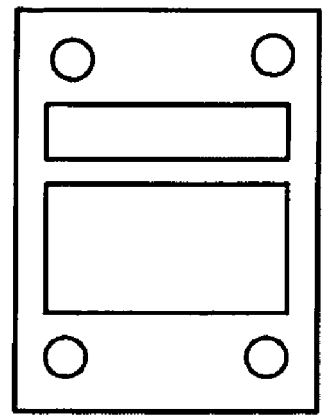
Figure 5:
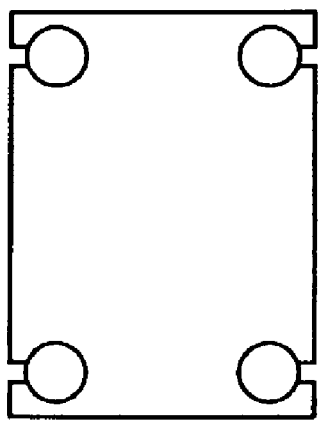
Figure 5:
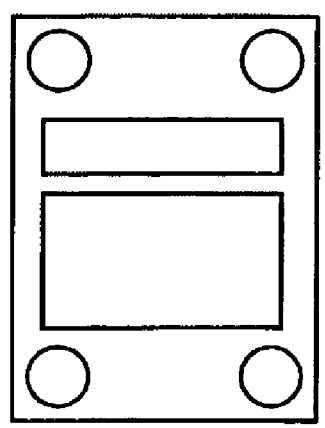
Figure 5:
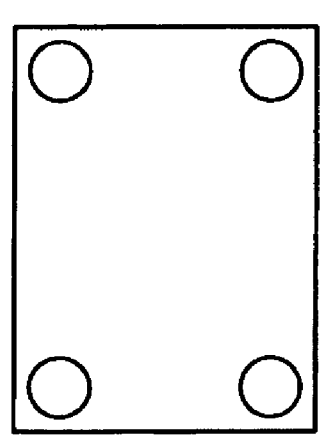

As show in FIG. 2, using the mask shown in FIG. 5(a) on the principal surface of the piezoelectric substrate, an Al film is formed by vapor-deposition or sputtering, after which a photosensitive resist is coated, and then after exposure and development, a gas such as $CCl_4$ or $SiCl_4$ is used to form a pattern, thereby forming the IDT electrodes and wiring electrodes.

Next, the mask shown in FIG. 5(b) is used to form a $SiO_2$ film on the entire principal surface of the piezoelectric substrate by sputtering or plasma CVD or the like, except in locations where the electrode posts are formed.

In addition, a photosensitive resin (for example, a BCB resin (Cyclotene (registered trademark)) is applied to the $SiO_2$ film except where the IDT electrode section and wiring electrodes are formed. Then using the mask shown in FIG. 5(c), the $SiO_2$ film is removed by photolithography to expose the IDT electrodes and wiring electrodes.

Here, by using a probe card or the like on the piezoelectric substrate, a probe test is performed in wafer level, and defective chips (piezoelectric elements) are marked.

Next Cr serving as the adhesion layer and Cu serving as the conductor layer are vapor-deposited on the insulating layer, a resist is coated, and then the IDT electrodes and wiring electrodes are exposed by photolithography, after which the Cr and Cu adhered to the resist is removed by a lift-off process, thereby forming the rewiring layer.

Next, a photosensitive resin film is laminated, after which the outer wall section is formed by photolithography.

In addition, in the same manner, a photosensitive resin film is laminated onto the outer wall section, and then the roof section is formed by photolithography to form a resin seal section P. As a result, a hollow section C (refer to FIG. 1) enclosed by the outer wall section 4 and the ceiling section 5 is formed in the resin seal section P.

Furthermore, the electrode posts 6 are formed in the holes formed in the outer wall section 4 and the ceiling section 5 by Cu electroplating, and the terminal electrodes 7 are formed on the electrode posts 6 by Ni and Au electroless plating.

After the electroplating is completed, the piezoelectric substrate (wafer) is divided by dicing along the scribe lines formed in the piezoelectric substrate, thereby obtaining individual piezoelectric components (SAW devices).

Embodiment 1

First, embodiment 1 of a piezoelectric component manufacturing method of the present invention (in which, of the Cr and Cu vapor deposited layers, the Cr and Cu which adheres to the resist layer is removed by a wet etching process) is described in detail.

Figure 3:
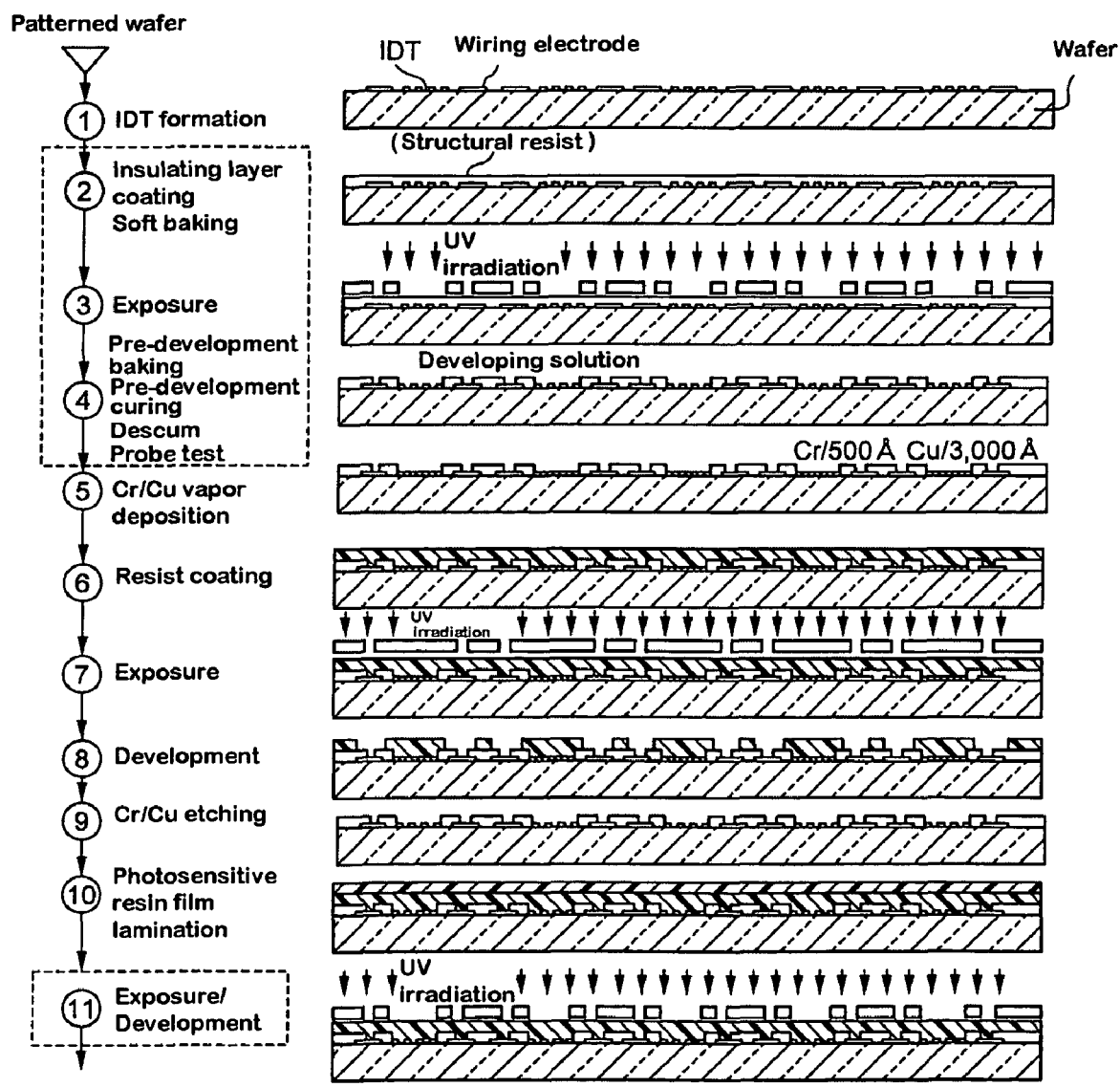
FIG. 3 is a detailed process drawing of embodiment 1 (in which Cr and Cu formed on the resist are removed by an organic solvent) of the method of manufacturing the SAW device shown in FIG. 2, showing from step (1) (IDT electrode/wiring electrode formation) to step (11) (exposure and development of the laminated photosensitive resin film).
Figure 4:
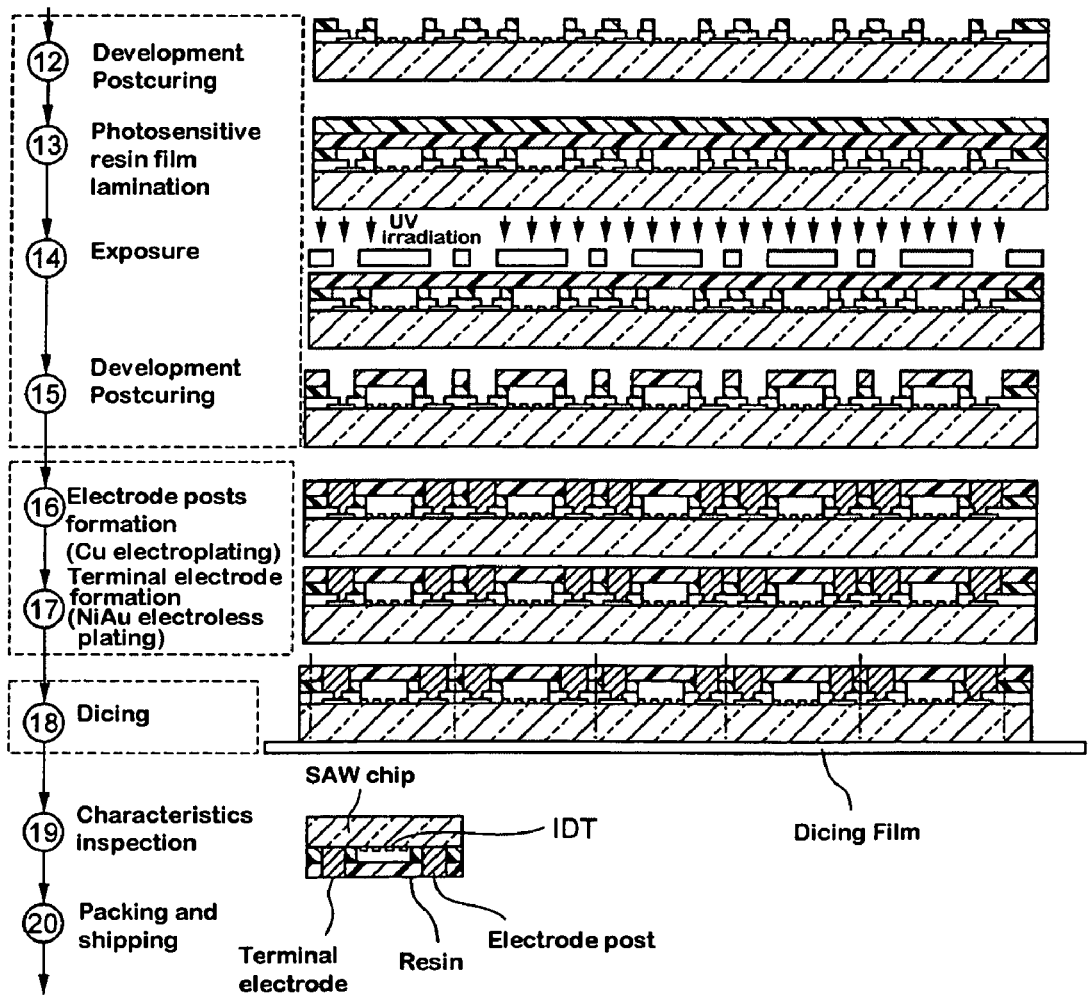
FIG. 4 is a detailed process drawing of embodiment 1 of the method of manufacturing the SAW device shown in FIG. 2, showing from step (12) (development and curing) to step (20) (packaging and shipping).

As shown in FIG. 3, in embodiment 1 of the present invention, in step (1) an Al film is vapor-deposited on an integrated piezoelectric substrate 2, using the mask shown in FIG. 5(a), to form the IDT electrodes and the wiring electrodes. Then using the mask shown in FIG. 5(b), a $SiO_2$ film is formed by sputtering or plasma CVD or the like on the IDT electrodes and wiring electrodes formed on the principal surface. After the $SiO_2$ film is formed, because the $SiO_2$ film has insulating properties, a photosensitive resist is applied, and patterned (exposed and developed), and the $SiO_2$ is then removed from the parts where conductivity is required (IDT electrodes and wiring electrodes) by dry etching.

Next, because the $SiO_2$ film formed on the principal surface of the piezoelectric substrate has an extremely thin film thickness (500 Å or less), if pinholes or the like are present when the rewiring layer is formed there is a danger of electrical shorting. Consequently in step (2) the $SiO_2$ film surface (except the IDT electrode and terminal electrode sections; thus the photosensitive resin is exposed and the unnecessary portion developed and removed only where the insulating layer is to be formed) is coated with an organic material with a low dielectric constant such as BCB resin (benzocyclobutene; registered trademark "Cycloten") as a structural resist, thereby forming an insulating layer for rewiring. At this time, patterning is performed so that the insulating layer is not formed upon the IDT electrodes.

The application of this BCB resin is performed by spin coating in two stages, namely 500 rpm for 10 seconds and 5000 rpm for 20 seconds. Subsequently, soft baking is performed at 60° C. for 90 seconds.

From step (3) to (4), first, in step (3), using the mask shown in FIG. 5(c), exposure by UV irradiation (150 mJ/cm$^2$, i-line) is performed, then in step (4) pre-exposure baking is performed (60° C. for 90 seconds), and after soaking in developing solution for 60 seconds, postcuring is performed in an $N_2$ gas atmosphere at 250° C. for 1 hour. Then, after curing, a descum process is performed to remove scum (residue and dirt) from the insulating layer surface. By this descum process, for example, the insulating layer thickness changes from 2.2 μm to a thickness of 2.1 μm.

Here, by using a probe card or the like on the piezoelectric substrate, a probe test (in-process characteristics inspection) is performed and defective chips (piezoelectric elements) are marked.

Next, the rewiring layer is formed on the insulating layer.

In the manufacturing method for a SAW device of embodiment 1 of the present invention, the objects are: to form the electrode posts at low cost by using the rewiring layer as a conductive path during electroplating, and, by the aforementioned probe test, to check for and exclude defective chips in piezoelectric substrate (wafer) level during the film deposition steps. Consequently, the rewiring layer of the present invention is characterized in that electrodes are formed in a grid shape corresponding to the product units ultimately cut from the piezoelectric substrate (wafer), and an electrical connection is made to this grid portion, and the electrodes which form the electrode posts are electrically connected.

Furthermore, the rewiring layer must be a material with excellent adhesion to $SiO_2$, BCB resin, or Al alloy or the like. For this reason, because if the rewiring layer is formed by simply vapor-depositing Cu, adhesion is poor and film detachment can occur, first, Cr is formed as an adhesion layer on the insulating layer, and then Cu as a conductor layer is deposited thereon to form the rewiring layer.

Furthermore, the removal of scum (residue and dirt) before rewiring layer formation, is performed in a $CF_4$ (80%) $O_2$ (20%) mixed gas ($CF_4$:5 SCCM, $O_2$:20 SCCM) atmosphere at heat of 280 w, for 1 minute.

In addition, removal of residue is performed by etching (the entire surface) of the insulating layer by a mixed gas of $CF_4$ and $O_2$ gases, to ensure the adhesion of the deposited metallic layers (Cr, Cu). Here, the rewiring layer electrically connects predetermined locations on the insulating layer, for example the terminal electrodes and the grid-shaped electrodes provided on the scribe lines, and is formed in locations which bridge IDT electrodes with wires having mutually different electrical potentials.

Specifically, after descumming, in step (5), except in the regions where the electrode posts are formed by electroplating in a later step, a resist is formed, Cr and Cu are vapor-deposited onto the entire surface of the piezoelectric substrate, and the Cr and Cu on the resist are removed when removing the resist, by using a solvent. By this vapor deposition, a rewiring layer with a thickness of 500 Å (Cr) and a thickness of 3000 Å (Cu) is formed on the insulating layer surface. Next, after the rewiring layer is formed, the rewiring layer surface is coated with a resist (step (6)), exposure is performed by UV irradiation using the mask shown in FIG. 5(d) (step (7)), and after development (step (8)), the metallic layers adhered to the resist surface are removed (step (9)).

Here, the rewiring layer, in order to suppress oxidation of the Cu, may adopt a Cr, Cu, and Au film structure. Moreover, after vapor-depositing the Cr and Cu on the entire surface of the piezoelectric substrate, and forming a resist film in the regions which are left by photolithography to serve as the conductor layer, wet etching may be performed to dissolve and remove the regions where the resist film is not formed. In this case, for Cu etching a ferric chloride solution is used, and for Cr etching, a commercially available proprietary solution or a potassium ferricyanide/NaOH aqueous solution or the like is used.

Here, the conductor layer may be a vapor-deposited film of Cr and Al, a sputtered film of Ti, W, and Cu, or a sputtered film of TiW and Al.

In addition, if forming the electrode posts from Cu, the insulating layer is formed on the piezoelectric substrate (except at the IDT electrode region and electrode terminal region), a photosensitive resin (for example Cyclotene (registered trademark)) is coated thereon (except at the IDT electrode region and electrode terminal region), only the required regions of the photosensitive resin are exposed, and the non-required regions are developed and removed.

Next, on the surface of the conductor layer (rewiring layer) composed of Cr and Cu films, a photosensitive resin film (thickness: 30 to 50 μm) is softened under a heating temperature of 60° C. to 80° C., and affixed and laminated thereon by a roll coater or the like (step (10)).

Furthermore, using the mask shown in FIG. 5(e), exposure is performed by UV irradiation (300 mJ/cm$^2$ (i-line)) (step (11)), after which developing and postcuring are performed to form the outer wall section (step (12)).

Still further, another photosensitive resin film is heated to 60° C. to 80° C., and affixed and laminated by a roll coater or the like onto the top end surface of the previously formed outer wall section (step (13)), exposure is performed using the mask shown in FIG. 5(e) by UV irradiation (300 mJ/cm$^2$) (step (14)), and then development and postcuring are performed to form the ceiling section. As a result, hermetic hollow sections C are formed between the inner walls of the outer wall sections and the inner walls of the ceiling sections which form the resin seal sections P.

Next, in the outer wall sections and ceiling sections formed from photosensitive resin film, the existing holes are filled by performing Cu electroplating to form electrode posts (refer to FIG. 1). Then Ni and Au electroless plating is performed on the bottom ends of the electrode posts to form the terminal electrodes.

Here, the electrode posts are formed by Cu electroplating, and the terminal electrodes are formed by performing Ni and Au electroless plating on the bottom surfaces of the electrode posts. As a result, oxidation of the Cu-based electrode posts can be prevented, and the solderability of the electrode posts for customers is enhanced. Here, instead of Ni and Au plating, the plating of the terminal electrodes may be performed as electroless plating or electroplating with Au only, or with Ni, Pd, and Au.

Then, after electroplating of the electrode posts is completed, the piezoelectric substrate is divided into individual piezoelectric components along the scribe lines, to obtain separate piezoelectric components (step (18)).

Here, the method of forming the scribe lines may be a method of forming only scribe lines in an Al film (during formation of the first layer, that is the electrodes), or a method of forming the scribe lines when forming the second layer, that is the rewiring layer. However, to lower the wiring resistance and minimize variability in electroplating, scribe lines are preferably formed in the piezoelectric substrate during the formation of both the first layer electrodes and the second layer rewiring layer.

Finally, after performing a characteristics inspection (step (19)), the piezoelectric component (SAW chip) is packaged and shipped (step (20)).

Embodiment 2

Next, embodiment 2 of a piezoelectric component manufacturing method of the present invention (in which the Cr and Cu is removed from the rewiring insulating layer by a lift-off process) is described in detail.

Figure 6:
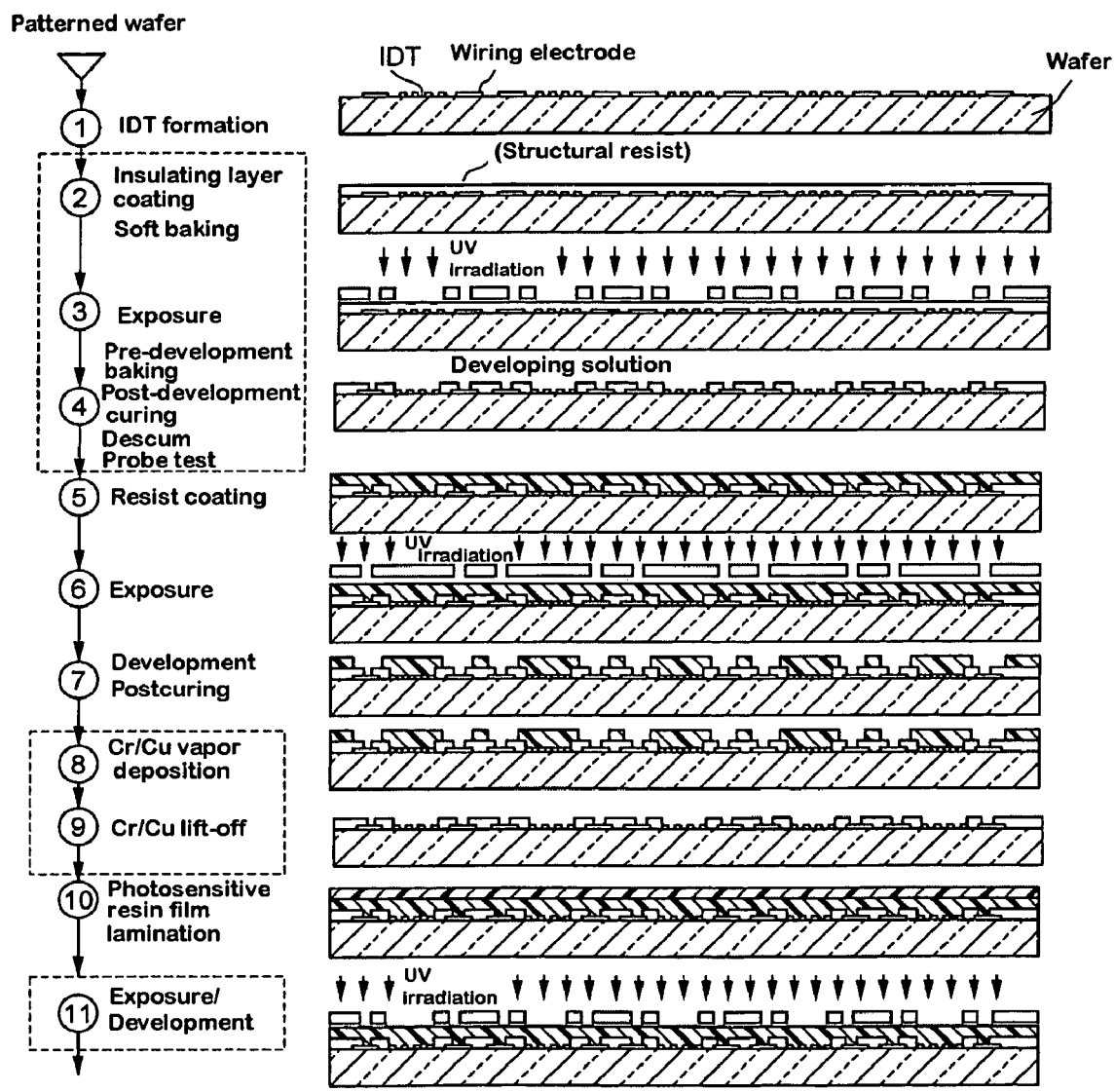
FIG. 6 is a detailed process drawing of embodiment 2 (in which Cr and Cu are removed by a lift-off process) of the manufacturing method for the SAW device shown in FIG. 2, showing from step (1) (IDT electrode/wiring electrode formation) to step (11) (exposure and development of the laminated photosensitive resin film).
Figure 7:
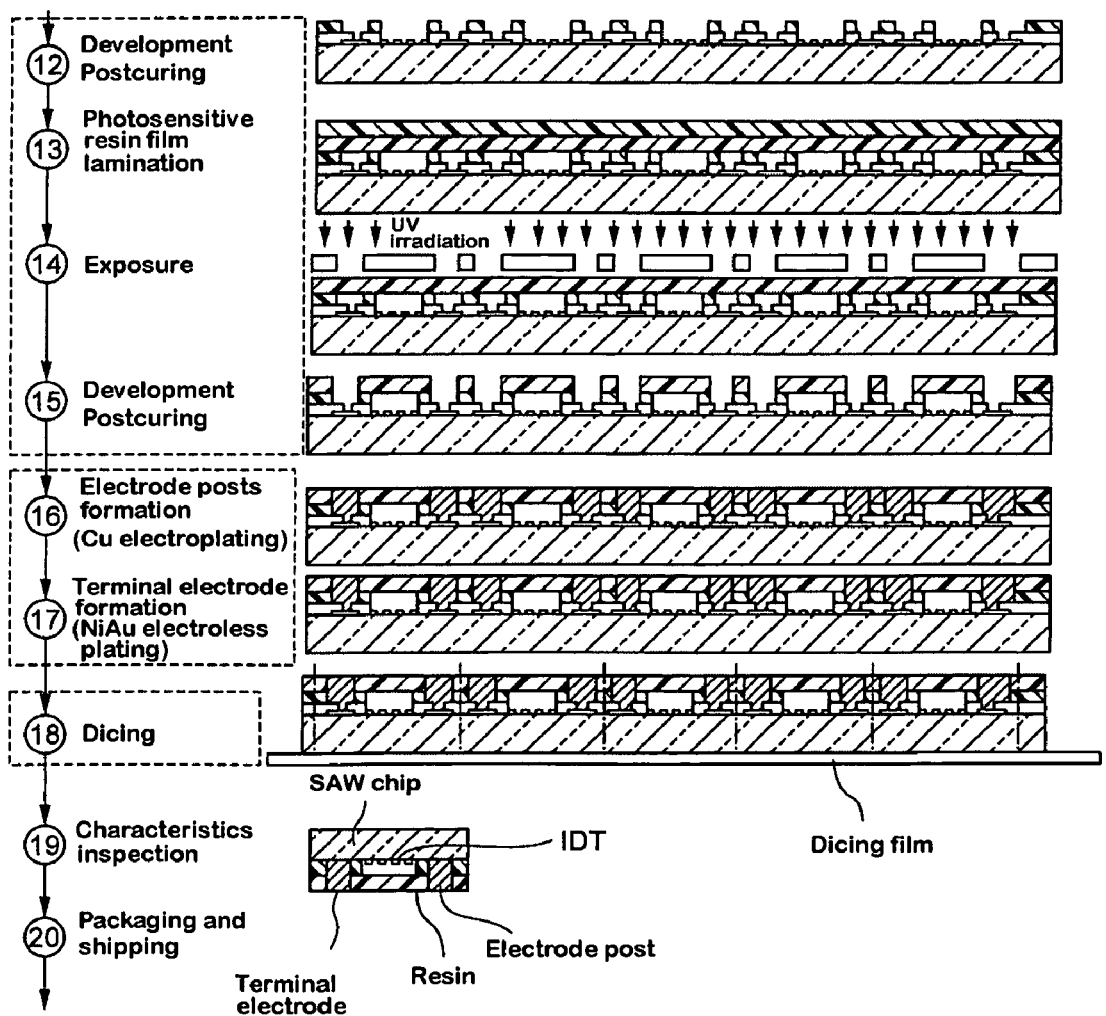
FIG. 7 is a detailed process drawing of embodiment 2 of the manufacturing method for the SAW device shown in FIG. 2, showing from step (12) (development and curing) to step (20) (packaging and shipping).

As shown in FIG. 6, in this embodiment 2, from step (1) to step (4) is the same as the steps in the previous embodiment 1 shown in FIG. 3.

In embodiment 2, instead of the Cr and Cu vapor deposition in step (4) (development/postcuring/descumming) in embodiment 1, as shown in FIG. 6, resist coating (step (5)) is performed next. Here, the process conditions for the resist coating are the same as embodiment 1.

Next, using the mask shown in FIG. 5(c), exposure by UV irradiation (step (6)), and development and postcuring (step (7)) are performed.

Then, Cr and Cu vapor deposition are performed on the resist-coated surface (step (8)) to form the rewiring layer, and by a lift-off process, unnecessary Cr and Cu adhered to the resist surface is removed (step (9)). Here, the point of difference from embodiment 1 is that in embodiment 1, resist coating is performed after Cr and Cr vapor deposition and Cr and Cu etching, but in contrast, in embodiment 2, Cr and Cr vapor deposition and Cr and Cu lift-off are performed after resist coating.

Hereafter, from step (11) (exposure) to step (20) (packaging and shipping) are the same as the steps in embodiment 1.

The piezoelectric component and manufacturing method thereof of the present invention can be widely applied to piezoelectric elements and components for which extremely high reliability is demanded, such as SAW devices, piezoelectric thin film filters, FBARs, and MEMSs, and their manufacture.

What is claimed is:

1. A piezoelectric component manufacturing method comprising:
    a step for preparing an integrated piezoelectric substrate, and forming comb-shaped electrodes and wiring electrodes having element wiring connecting to the comb-shape electrodes on a primary surface of the piezoelectric substrate, by sputtering or vapor deposition;
    a step for forming an SiO$_2$ layer by coating an entire primary surface of said piezoelectric substrate on which said comb-shaped electrodes and said wiring electrodes are formed;
    a step for performing a characteristics inspection on the piezoelectric substrate and marking defective piezoelectric elements;
    a step for coating said SiO$_2$ layer surface, excluding at least said comb-shaped electrodes and said wiring electrodes, with photosensitive resin, and then exposing and developing to form an insulating layer;
    a step for vapor-depositing a metal layer serving as an adhesion layer and an electrode layer on a surface of said insulating layer, and removing said metal layer adhered to resist by an organic solvent when removing the resist, to form a rewiring layer;
    a step for coating said rewiring layer, excluding said comb-shaped electrodes and said wiring electrode forming section, with photosensitive resin, and then exposing and developing to form a photosensitive resin layer which forms outer wall sections;
    a step for affixing a photosensitive resin film to a top end surface of said photosensitive resin layer, and then exposing and developing to form ceiling sections, and at the same time removing said photosensitive resin layer and said photosensitive film at the region where electrode posts are to be formed, to form holes;
    a step for forming electrode posts in the holes by electroplating; and
    a step for dicing, after said electroplating is completed, said piezoelectric substrate along scribe lines to obtain individual piezoelectric components.

2. A piezoelectric component manufacturing method according to claim 1, wherein said rewiring layer is formed before spreading of photosensitive resist, and in a later step after spreading of the photosensitive resist, unnecessary portions of the spread resist are removed by wet etching.

3. A piezoelectric component manufacturing method according to claim 1, wherein after forming said electrode posts, a distributed constant circuit is formed on a rear surface of said ceiling section, and a terminal electrode is formed on an other end of said electrode post.

4. A piezoelectric component manufacturing method according to claim 1, wherein a hole for said electrode post formation, is formed by dry etching using laser light or reactive gas.

5. A piezoelectric component manufacturing method according to claim 1, wherein said piezoelectric substrate is thinned by grinding from a facing side of said comb-shape electrodes, after forming individual piezoelectric components.

6. A piezoelectric component manufacturing method according to claim 1, wherein an insulating layer made from an organic material such as photopolyimide, or epoxy is formed on a surface of a resin seal section made from said outer wall section and said ceiling section.

7. A piezoelectric component manufacturing method according to claim 1, wherein said electrode posts are formed by Cu electroplating, and terminal electrodes formed on the end of said electrode post are formed by Ni and Au electroless plating.

8. A piezoelectric component manufacturing method according to claim 1, wherein terminal electrodes formed on the tip end of said electrode post are formed by electroless plating or electroplating with only Au, or with Ni, Pd and Au.

9. A piezoelectric component manufacturing method according to claim 1, wherein an adhesion layer made from Cr is deposited on said insulating layer, and a conductor layer made from Cu is deposited on the Cr to form said rewiring layer.

10. A piezoelectric component manufacturing method according to claim 1, wherein a conductor layer of said rewiring layer is formed by vapor-depositing Cu and Al, or by sputtering Ti, W, and Cu, or by sputtering Ti, W, and Al.

* * * * *